United States Patent [19]
Monk et al.

[11] Patent Number: 5,729,157
[45] Date of Patent: Mar. 17, 1998

[54] OFF-CHIP DRIVER CIRCUIT

[75] Inventors: Trevor Monk, Chepstow, United Kingdom; Curtis Dicke, Colorado Springs, Colo.

[73] Assignee: SGS-Thomson Microelectronics Limited, Bristol, United Kingdom

[21] Appl. No.: 506,879

[22] Filed: Jul. 25, 1995

[30] Foreign Application Priority Data

Jul. 25, 1994 [GB] United Kingdom ............... 9414928

[51] Int. Cl.$^6$ ............... H03K 19/0175; H03K 19/094
[52] U.S. Cl. ............... 326/80; 326/68; 326/83
[58] Field of Search ............... 326/68, 80, 83; 327/108, 109

[56] References Cited

U.S. PATENT DOCUMENTS

| | | | |
|---|---|---|---|
| 3,995,171 | 11/1976 | Sonoda | 326/83 |
| 4,709,162 | 11/1987 | Braceras et al. | |
| 4,782,250 | 11/1988 | Adams et al. | |
| 4,963,766 | 10/1990 | Lundberg | |
| 5,151,619 | 9/1992 | Austin et al. | 307/473 |
| 5,160,855 | 11/1992 | Dobberpuhl | |
| 5,406,140 | 4/1995 | Wert et al. | 326/81 |
| 5,534,795 | 7/1996 | Wert et al. | 326/83 |
| 5,552,719 | 9/1996 | Murakami | 326/83 |
| 5,576,635 | 11/1996 | Partovi et al. | 326/83 |
| 5,635,861 | 6/1997 | Chan et al. | 326/86 |

FOREIGN PATENT DOCUMENTS 0 480 201 A1  4/1992  European Pat. Off.

OTHER PUBLICATIONS

Takahashi, Makoto, et al., "3.3V–5V Compatible I/O Circuit without Thick Gate Oxide," *IEEE 1992 Custom Integrated Circuits Conference*, pp. 23.2.1–23.3.4.

*Digest of Technical Papers*, p. 107, Dec. 1992. ISSCC92.

Wong et al., "11–NS 8K×18 CMOS Static Ram with 0.5 μM Devices," *IEEE Journal of Solid–State Circuits* 23(5):1100–1102, Oct. 1988.

"Mixed Technology Overvoltage Protection," *IBM Technical Disclosure Bulletin*, vol. 34, No. 4B, Sep. 1991, pp.147–149.

*Primary Examiner*—Edward P. Westin
*Assistant Examiner*—Richard Roseen
*Attorney, Agent, or Firm*—David V. Carlson; Seed and Berry LLP

[57] ABSTRACT

An off-chip driver circuit having circuitry for providing protection against high voltages when the off-chip driver circuit is disabled is described. The circuitry for providing protection against high voltages utilizes a minimum number of transistors and therefore minimizes the chip area utilized by the off-chip driver circuit. An off-chip driver circuit has an input terminal and an output terminal. A pull-up transistor has a controllable path connected between a first power supply voltage and the output terminal of the off-chip driver circuit, and a control terminal connected to the input terminal via a pass gate connected to isolate the input terminal from high voltages applied to the output terminal. A control transistor has a controllable path connected between the control terminal of the pull-up transistor and the output terminal, and a control terminal connected to a control potential. An auxiliary pass transistor has a control terminal and a controllable path connected between a reference terminal and the control terminal of the pull-up transistor. An auxiliary control transistor has a control terminal connected to receive the control potential, and a controllable path connected between the output terminal and the control terminal of the auxiliary pass transistor. Auxiliary circuitry holds the control terminal of the auxiliary pass transistor in a state determined by the auxiliary control transistor. The auxiliary circuitry may include an auxiliary pull-down transistor having a controllable path connected between the control terminal of the auxiliary pass transistor and a reference potential, and a control terminal connected to a voltage selected to maintain the auxiliary pull-down transistor on.

29 Claims, 2 Drawing Sheets

OFF-CHIP DRIVER CIRCUIT

TECHNICAL FIELD

This invention relates to an off-chip driver circuit and is particularly but not exclusively concerned with an off-chip driver circuit implemented in CMOS technology and which has a supply voltage less than the supply voltage of external circuits which may be connected to the output of the off-chip driver circuit.

BACKGROUND OF THE INVENTION

An off-chip driver circuit should be designed not only to successfully drive logic levels relating to the supply voltages of the circuit off-chip but to be protected against any high voltages which may occur when the off-chip driver circuit is disabled and its output terminal is coupled to an external circuit operating at a higher supply voltage. It is desirable to provide this protection while minimizing the number of transistors and therefore the chip area utilized by the off-chip driver circuit.

FIG. 1 is a circuit diagram of a known off-chip driver circuit. This circuit is described in U.S. Pat. No. 5,151,619 assigned to International Business Machines Corporation but is described in the following by way of background to the present invention. The off-chip driver circuit has first and second input terminals, IN, IN' which are connected to a pre-driver circuit. The off-chip driver circuit is arranged in an output mode to drive a signal at the input terminals IN, IN' to an output terminal OUT. When the off-chip driver circuit is used in this mode, the signal level on the first input terminal IN is the same as the signal level on the second input terminal IN'. A first p-channel field effect transistor 2 acting as a pull-up transistor and a second n-channel field effect transistor 4 acting as a pull-down transistor are serially arranged between a supply voltage Vdd and a point of reference potential Vss. The reference potential will generally be at ground. The output terminal OUT is taken at a point between the pull-up transistor 2 and the pull-down transistor 4. A pass gate 6 is formed by an n-channel transistor 8 having its gate connected to receive the supply voltage Vdd and its drain/source path connected between the input terminal IN and the gate of the pull-up transistor 2. The n-channel transistor 8 acts in cooperation with a p-channel transistor 10 connected with its drain/source path in parallel with the drain/source path of the n-channel transistor 8 and its gate connected to the output terminal OUT.

The pull-down transistor 4 has its gate connected to the second input terminal IN'.

The off-chip driver circuit includes a control transistor 12 which has its gate connected to a control potential Vref and its drain/source path connected in series between the pass gate p-channel transistor 10 and the output terminal OUT. The pass gate p-channel transistor 10 and the control transistor 12 are formed in a common n-well 16. A further p-channel transistor 14 is connected to act as an n-well bias transistor and is connected between the supply voltage Vdd and the n-well 16, with its gate connected to the output terminal OUT.

The off-chip driver circuit has its output terminal OUT selectively connectable to an external circuit 18 which has a separate supply voltage Vcc and which is used in an input mode of the off-chip driver circuit to supply signals onto the chip via the output terminal OUT which is connected to an input signal line (not shown).

The voltage supply for the off-chip driver circuit is typically about 3.3V ±0.3V. However, the external circuit may operate at a higher voltage, for example conventional CMOS levels of about 5V. When used as an off-chip driver circuit, the circuit should be capable of driving the output terminal at 0V (for a logical zero) or 3.3V±0.3V (for a logical one). However, when not being used, the circuit needs to be able to tolerate voltages in the range of 0 to 5V which may be supplied at the output terminal OUT from the external circuit 18. The off-chip driver circuit should also be able to tolerate breakdown conditions in the external circuit 18, which may take the voltage applied to the output terminal OUT as high as about 7V.

As is well known, and more fully discussed in the above-referenced U.S. Pat. No. 5,151,619, with the input terminals IN, IN' at a logical zero the voltage at the output terminal OUT will be at Vdd. With the first and second input terminals IN, IN' at 3.3±0.3V the voltage at the output terminal OUT will be at a low voltage of approximately 0V.

To disable the off-chip driver circuit, the pre-driver circuit attached to the first and second input terminals IN, IN' is tristated so that with the first input terminal IN high, the second input terminal IN' is low. Typically, with the off-chip driver circuit in a disabled condition, the input terminal IN is at 3.3V±0.3V and the input terminal IN' is at 0V. In this condition, the pull-down n-channel transistor 4 is off.

The circuit of FIG. 1 is designed to operate when disabled as follows. With a voltage of 0V at the output terminal OUT, the pass gate p-channel transistor 10 is turned on and passes the voltage of 3.3V±0.3V on the first input terminal IN to the gate of the pull-up transistor 2, thus mining it off. Thus, there is no leakage current through the pull-up transistor 2. When a high voltage, for example of 5V is applied to the output terminal OUT by the external circuit 18, the p-channel pass gate transistor 10 is mined off. However, the p-channel control transistor 12 is mined on because the voltage applied at its source exceeds the control voltage Vref at its gate. This thus presents the voltage at the output terminal OUT to the gate of the pull-up p-channel transistor 2, likewise mining it off. In this condition, the voltage at the gate of the p-channel transistor 2 is roughly the same as the voltage on the source of the p-channel transistor 2 and therefore the oxide of the p-channel transistor is not subject to any significant stress. Therefore, in these conditions at the extreme ends of the likely voltages to be imposed by the external circuit 18, the prior art circuit of FIG. 1 works well.

However, problems arise at median conditions and in transition states. Consider first the state where the voltage at the output terminal OUT is changing from 5V to 0V. As described above, at 5V the control transistor 12 is on, the pass gate p-channel transistor 10 is off and thus 5V is passed to the gate of the pull-up p-channel transistor 2. On the assumption that the control voltage Vref at the gate of the control transistor 12 is about the same as Vdd, namely 3.3V±10%, the transistor 12 will cease to be on at a voltage which is the control voltage Vref plus a threshold voltage Vtp (0.7V, say), namely about 4V. In this condition, about 4V will remain floating at the gate of the pull-up p-channel transistor 2 while the source of that transistor coupled to the output terminal OUT will see a lowering voltage as the voltage on the output terminal OUT drops down to zero. Thus, the gate to source voltage of the pull-up transistor 2 may exceed the prescribed values permitted for stresses applied to the oxide. This state will endure until the voltage on the output terminal OUT has dropped to a sufficiently low level to mm on the pass gate p-channel transistor 10 which will then provide a discharge path to balance the voltage at the gate of the pull-up transistor 2 with the voltage on the first input terminal, which is at about 3.3V+10%.

There is thus a window or "dead zone" of Vref±Vtp where neither the pass gate transistor 10 nor the control transistor 12 is ON. During this dead zone, the voltage at the gate of the pull-up transistor 2 is not tracking either the supply voltage Vdd or the output voltage.

Another difficulty arises at a so-called median condition. In order to turn the control transistor 12 on, the voltage at the output terminal must be at least a threshold voltage Vtp above the control voltage Vref at the gate of the control transistor 12. If this condition is not satisfied, the control transistor 12 will remain off. Consider the case where the voltage at the output terminal is slightly above or slightly below the reference voltage, normally 3.3V. Thus, the voltage is not low enough to turn on the p-channel pass gate transistor 10 nor is it high enough to turn on the control transistor 12. Thus, both the transistors 10 and 12 are off. The n-channel transistor 8 of the pass gate will try and pull up the gate of the p-channel transistor 2 but it will only be able to pull it up to a threshold below the voltage on the input, namely to about 2.6/2.7V. This is inadequate to reliably turn off the pull-up p-channel transistor 2 and therefore there will be a leakage current through that transistor. Thus, during transition states and at voltages within a threshold voltage of the supply voltage Vdd, the prior art circuit of FIG. 1 has several disadvantages.

One solution proposed to the problem of over-stressed gate oxide is to provide transistors with thicker oxides for those which are likely to be subject to stress. However, this increases the process costs because it requires two oxide deposition steps. Another solution is proposed in an article entitled "3.3V–5V Compatible I/O Circuit without Thick Gate Oxide" by Takahashi, et al in IEEE 1992 Custom Integrated Circuits Conference, 23.3.1–23.3.4. In that solution, different types of transistors are introduced to exclude undesirable leakage paths and to prevent oxide stresses. This solution also suffers from the disadvantage that it requires different fabrication techniques.

SUMMARY OF THE INVENTION

It is an object of the present invention to provide an off-chip driver circuit which overcomes the disadvantages outlined above using circuit techniques and without significantly increasing the amount of area required for the circuit.

According to the present invention there is provided an off-chip driver circuit having an input terminal and an output terminal: a pull-up transistor having a controllable path connected between a first power supply voltage and the output terminal of the off-chip driver circuit and a control terminal connected to the input terminal via a pass gate connected to isolate the input terminal from high voltages applied to the output terminal; a control transistor having a controllable path connected between the control terminal of the pull-up transistor and the output terminal and a control terminal connected to a control potential; an auxiliary pass transistor having a control terminal and a controllable path connected between a reference terminal and the control terminal of the pull-up transistor; an auxiliary control transistor, the auxiliary control transistor having a control terminal connected to receive said control potential and a controllable path connected between the output terminal and the control terminal of the auxiliary pass transistor; and auxiliary circuitry for holding the control terminal of the auxiliary pass transistor in a state determined by the auxiliary control transistor.

The auxiliary circuitry can comprise an auxiliary pull-down transistor having a controllable path connected between the control terminal of the auxiliary pass transistor and a reference potential, and a control terminal connected to a voltage selected to maintain the auxiliary pull-down transistor on.

Alternatively, the auxiliary circuitry can comprise first and second auxiliary pull-down transistors connected in series between the control terminal of the auxiliary pass transistor and a reference potential, said auxiliary pull-down transistors having control terminals connected respectively to a power supply voltage for the driver circuit and a voltage selected to maintain the auxiliary pull-down transistor on.

In the preferred embodiment, the reference terminal of the auxiliary pass transistor is connected directly to the data input terminal.

In the preferred embodiment, the pull-up transistor, isolation transistor, control transistor, auxiliary pass transistor and auxiliary control transistor are all p-channel transistors. It is particularly advantageous if they are formed in a common n-well which is biased by a further p-channel transistor having a control terminal coupled to the output terminal.

DETAILED DESCRIPTION OF THE INVENTION

For a better understanding of the present invention and to show how the same may be carried into effect, reference will now be made by way of example to FIG. 2.

Figure 1:
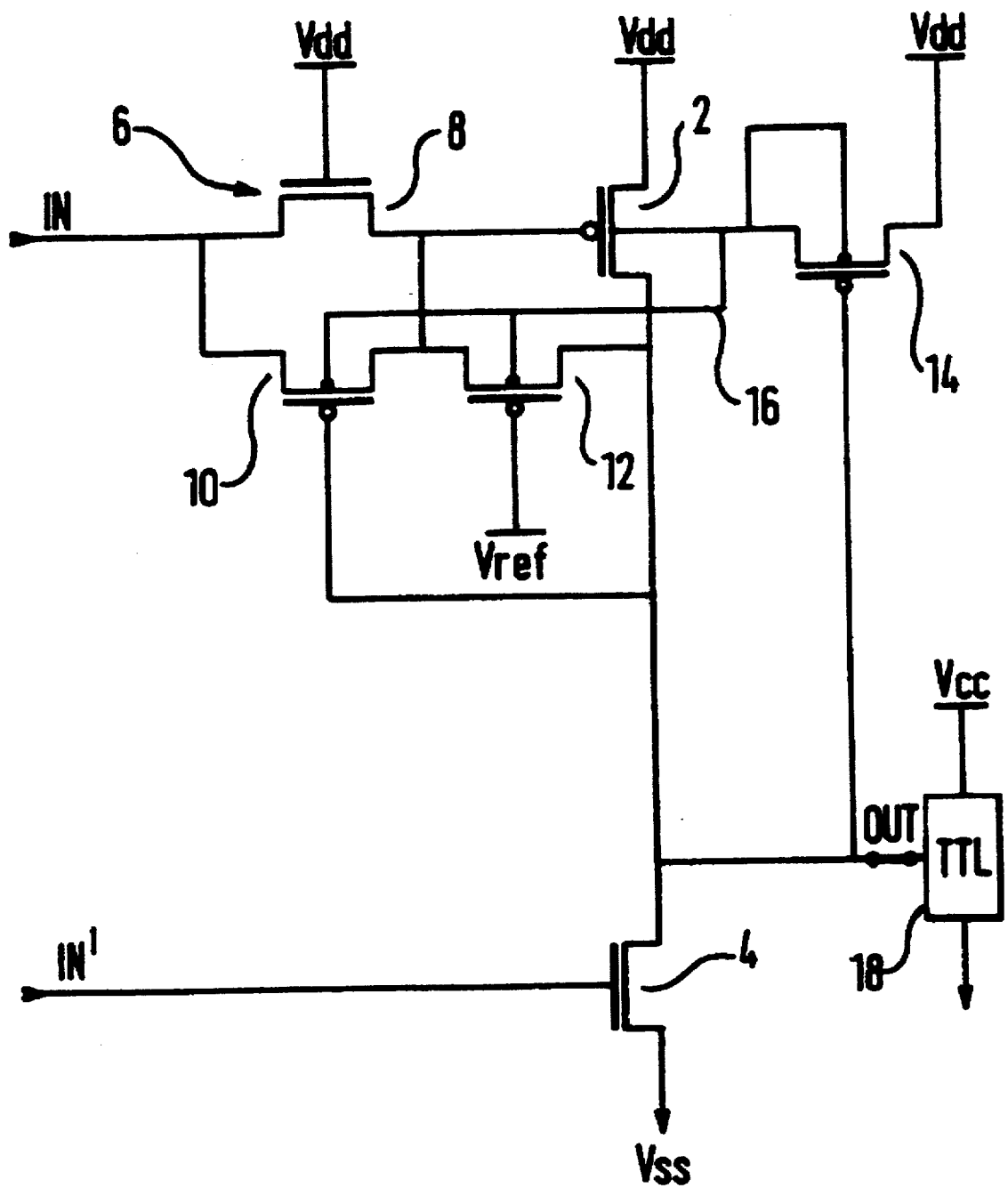
FIG. 1 is a circuit diagram of a known off-chip driver circuit.
Figure 2:
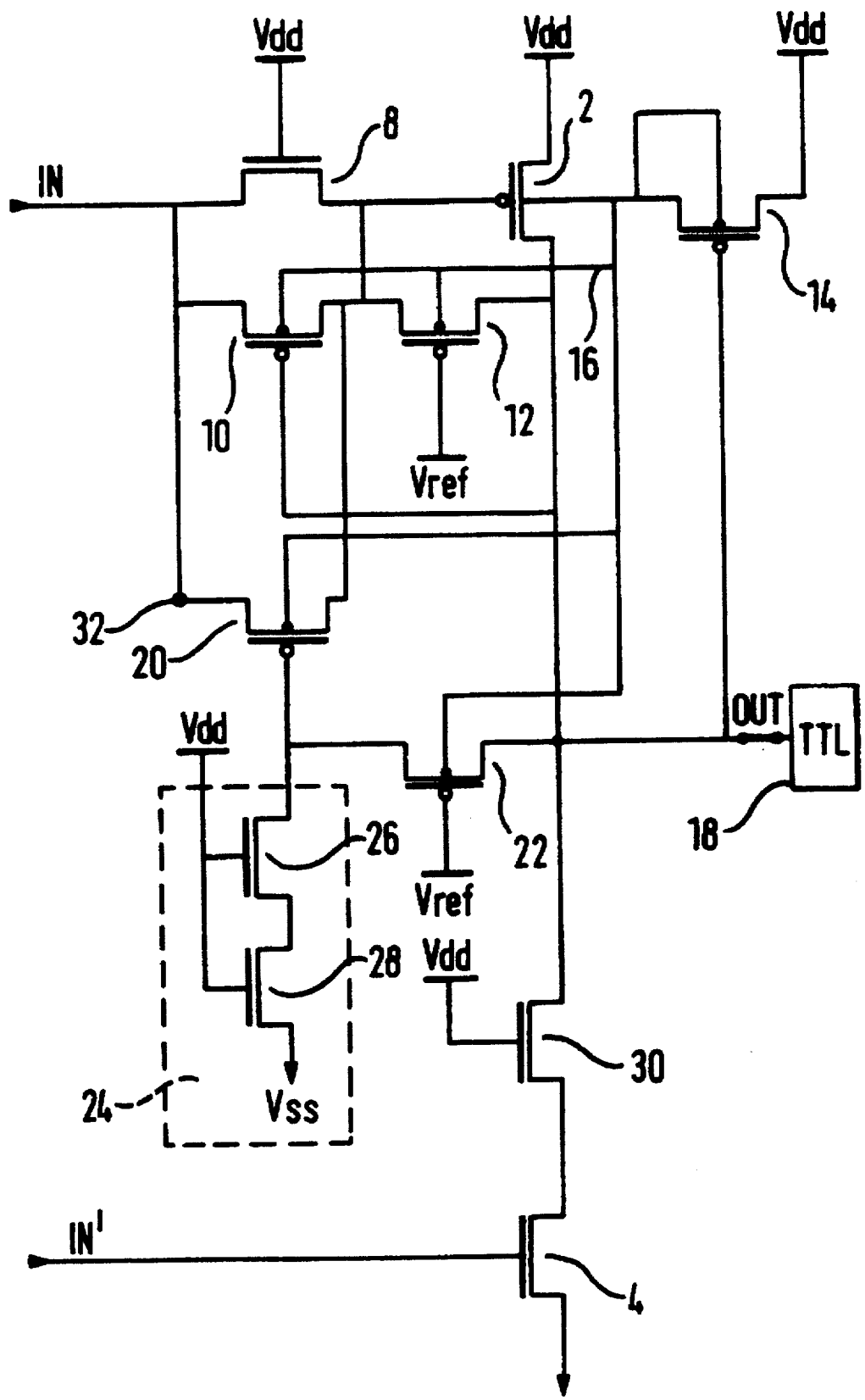
FIG. 2 is a circuit diagram of an off-chip driver circuit according to an embodiment of the present invention.

In FIG. 2, like numerals denote like parts as in FIG. 1. As these components have already been discussed, they will not be referred to again in the following except insofar as their operation is affected by the additional components introduced by way of the invention. The circuit of FIG. 2 additionally includes an auxiliary p-channel pass transistor 20 and an auxiliary control p-channel transistor 22. The auxiliary pass transistor 20 and the auxiliary control transistor 22 are, like the p-channel transistors 10 and 12 formed in the common n-well 16 biased by the transistor 14. The auxiliary control transistor 20 has its source/drain path connected between a reference terminal 32 and the gate of the pull-up transistor 2, and its gate connected to a pull-down device 24. In the illustrated embodiment the reference terminal 32 is connected directly to the data input terminal IN. The gate of the auxiliary pass transistor 20 is also connected to the output terminal OUT via the auxiliary control transistor 22. The auxiliary control transistor 22 has its gate connected to the control voltage Vref which is the same as the voltage applied to control the gate of the control transistor 12. In the preferred embodiment, Vref is the same as the supply voltage Vdd (3.3V±0.3V).

In the embodiment illustrated in FIG. 2, the pull-down device 24 is formed by two n-channel transistors 26, 28 in series between the gate of the auxiliary pass transistor 20 and a point of reference potential Vss, such as ground. The gates of the n-channel transistors 26, 28 are both tied to the supply voltage Vdd.

The circuit of FIG. 2 also additionally includes an n-channel transistor 30 in series between the pull-up p-channel transistor 2 and the pull-down n-channel transistor 4, with its gate tied to the supply voltage Vdd. This transistor merely serves to limit the voltage swings on the pull-down n-channel transistor 4, as discussed for example in IEEE Journal of Solid-state circuits, Vol. 23 No. 5, October 1988, Wong et al, pp. 1095–1102.

The auxiliary pass transistor 20 and the auxiliary control transistor 22 are both relatively small devices, of the same order of magnitude as the p-channel pass transistor 10 and the control transistor 12. The function of these transistors to overcome the problems discussed above will now be described.

Consider first the situation where the voltage applied to the output terminal OUT is switching from 5V to 0V. At 5V, the control transistor 12 is turned on, thereby presenting 5V to the gate of the pull-up p-channel transistor 2, firmly holding it off. Moreover, the pass gate transistor 10 is held off, isolating the input terminal from the high voltage. In this condition, the auxiliary control transistor 22 is also on, ensuring that the auxiliary pass transistor 20 is off. As the voltage at the output terminal reduces, it reaches a point, as discussed above, where it no longer holds the control transistor 12 on. As the control transistor 12 rams off, so too does the auxiliary control transistor 22 because it is subject to the same conditions as the control transistor 12. As the auxiliary control transistor 22 rams off, it causes the auxiliary pass transistor 20 to turn on. The pull-down device 24 holds the gate of the auxiliary pass transistor 20 low. This provides a discharge path for the voltage at the gate of the p-channel pull-up transistor 2 to the first input terminal to reduce the voltage at the gate of the p-channel pull-up transistor 2 to a value approximately equal to that at the input terminal, namely 3.3V±0.3V. Note that during this time, the p-channel pass gate transistor 10 is still off. Thus, the auxiliary pass transistor 20 provides an additional discharge path in the situation of transiting voltages on the output terminal to ensure that the pull-up p-channel transistor 2 is not subject to excessive gate source voltages and therefore excessive stresses on the oxide.

Another problem arose with the prior art circuit of FIG. 1 at so-called median voltages, within a threshold voltage of the control voltage Vref. Consider now such a voltage, of for example, just above or just below 3.3V. When this voltage is applied to the output terminal OUT, the control transistor 12 is not turned on. Therefore, the auxiliary control transistor 22 is also not turned on. Thus, the auxiliary pass transistor 20 is turned on and provides a path from the first input terminal to the gate of the p-channel transistor 2 to allow it to pass more or less its full 3.3V±0.3V to the gate of the pull-up p-channel transistor 2, thus firmly mining it off. This prevents leakage current in this condition. It will readily be appreciated that there may still be a small amount of leakage current even while using the invention, but this will be maintained well below specification levels of about 20–30 uA. In contrast, the prior art circuit of FIG. 1 could have a leakage current of the order of milliamps.

Although the pull-down device 24 is shown as being implemented by two n-channel transistors 26, 28 connected in series, it will readily be apparent that a single n-channel transistor could be used instead, or, indeed, any other implementation of a suitable pull-down device. In particular an ideal current sink could be used. Such an ideal current sink could be implemented with the transistor 26 having its gate connected to Vdd and with the transistor 28 having its gate connected to another voltage level, for example between 1 and 1.5V. The provision of two n-channel transistors in series limits the voltage swing across each of the transistors individually and therefore serves to protect them. It will readily be appreciated that the pull-down device 24 holds the gate of the auxiliary pass transistor 20 low when the auxiliary control transistor 22 is off.

The auxiliary pass transistor 20 is shown with its source/drain channel connected in parallel with that of the pass gate p-channel transistor 10, between the first input terminal and the gate of the pull-up transistor 2. However, it will readily be appreciated from the foregoing discussion that the auxiliary pass transistor 20 could instead have its reference terminal 32 connected to a potential of the order of Vdd to satisfy the protection requirements when the off-chip driver circuit is disabled and is in a tristate mode as discussed above. However, the circuit must also function in a conventional off-chip driver mode, where input signals are applied to the first and second input terminals from a pre-driver circuit. In this mode, the circuit operates substantially as described already with reference to FIG. 1. That is, with a logical one (about 3.3V±0.3V) the first and second input terminals IN, IN' the p-channel transistor 2 is turned off and the output terminal OUT is pulled down to zero by the n-channel transistors 30 and 4. With a logical zero (0V) on the input terminal IN, IN', the n-channel pass transistor 8 presents 0V to the gate of the p-channel transistor 2, thus mining it on. The output terminal OUT is therefore pulled up to Vdd.

In the first case (of a logical one being input), the auxiliary pass transistor 20 is on and therefore acts in parallel with the pass gate transistor 10, although it is substantially redundant. For this situation, it is of course important that the voltage at terminal 32 is at the same logical value to that at the first input terminal IN. In a second situation, of a logical zero at the first input terminal, the auxiliary control transistor 22 is still off because the voltage Vdd does not exceed the control voltage Vref by an adequate amount to turn it on, so that the auxiliary pass transistor 20 is on. In this situation however the auxiliary pass transistor 20 must act with the n-channel transistor 8 to pass 0V to the gate of pull-up transistor 2. Therefore, the reference terminal 32 in this situation needs to be connected to the logical equivalent of 0V. These logical requirements are ideally satisfied by connecting the terminal 32 to the first input terminal IN. It will nevertheless be appreciated however that the invention could be implemented by connecting the terminal 32 of the auxiliary pass transistor 20 to logic circuitry coupled to the first input terminal IN to satisfy these logical requirements.

The described embodiment of the present invention thus provides an off-chip driver circuit which can tolerate excessive voltages in its disabled mode. All source to drain voltages on output transistors are limited so as not to exceed Vdd and all gate to drain/source/bulk voltages are limited. Furthermore, input leakage during a disabled or tristate mode can be limited to below about 30 microamps in the preferred embodiment and to below 10 microamps when driven by signals the 0 to Vdd range.

While various embodiments have been described in this application for illustrative purposes, the claims are not so limited. Rather, any equivalent method or device operating according to principles of the invention falls within the scope thereof.

We claim:

1. An off-chip driver circuit comprising:

a first input terminal for accepting an input voltage between a first voltage level and a second voltage level, the first voltage level being higher than the second voltage level;

an output terminal electrically connectable to a logic circuit adapted to provide a signal switchable between a third voltage level and the second voltage level, the third voltage level being higher than the first voltage level;

a pull-up device having a control terminal, an input terminal coupled to a supply of the first voltage level, and an output terminal coupled to said output terminal of the driver circuit;

a pass circuit coupled between said first input terminal of the driver circuit and the control terminal of said pull-up device, said pass circuit having a first control terminal, said pass circuit controlling the control terminal of said pull-up device when the signal applied to said output terminal is switching between the third and second voltage levels and has a voltage level less than a fourth voltage level, the fourth voltage level being between the third and first voltage levels;

a control circuit having an input terminal coupled to said output terminal of the driver circuit, a first output terminal coupled to the control terminal of said pull-up device, and a second output terminal coupled to the first control terminal of said pass circuit, said control circuit controlling the control terminal of said pull-up device when the signal applied to said output terminal is switching between the third and second voltage levels and has a voltage level of the fourth voltage level or greater; and a first pull-down circuit coupled between the first control terminal of said pass circuit and a supply of the second voltage level, said first pull-down circuit holding the first control terminal of said pass circuit in a state determined by said control circuit.

2. The driver circuit of claim 1 wherein said pass circuit comprises:

a pass gate having a first control terminal coupled to a supply of the first voltage level and a second control terminal coupled to said output terminal of the driver circuit; and a pass transistor electrically connected in parallel with said pass gate, the first control terminal of said pass circuit being a control terminal of said pass transistor.

3. The driver circuit of claim 1 wherein said control circuit comprises:

a first control transistor having a control terminal coupled to a control potential, the control potential being substantially the same as the first voltage level, the input terminal of said control circuit being an input terminal of said first control transistor, the first output terminal of said control circuit being an output terminal of said first control transistor; and a second control transistor having a control terminal coupled to the control potential, the input terminal of said control circuit being an input terminal of said second control transistor, the second output terminal of said control circuit being an output terminal of said second control transistor.

4. The driver circuit of claim 1 wherein said first pull-down circuit comprises:

a first pull-down transistor coupled between the first control terminal of said pass circuit and a source of the second voltage level, said first pull-down transistor having a control terminal coupled to a source of the first voltage level.

5. The driver circuit of claim 4 wherein said first pull-down circuit further comprises:

a second pull-down transistor electrically connected in series with said first pull-down transistor and having a control terminal coupled to a source of the first voltage level.

6. The driver circuit of claim 4 wherein said first pull-down circuit further comprises:

a second pull-down transistor electrically connected in series with said first pull-down transistor and having a control terminal coupled to a source of a fifth voltage level between the first voltage level and the second voltage level.

7. The driver circuit of claim 1 wherein said first pull-down circuit comprises a current sink.

8. The driver circuit of claim 1, further comprising:

a second input terminal; and a second pull-down circuit coupled between said output terminal of the driver circuit and a source of the second voltage level and having a control terminal coupled to said second input terminal.

9. An off-chip driver circuit comprising:

a first input terminal;

an output terminal;

means for pulling up said output terminal to a source of a first voltage level responsive to a first signal received at a control terminal;

means for passing a signal from the first input terminal to the control terminal of said pull-up means, said passing means being responsive to a second signal and to a voltage at said output terminal;

control means for coupling said output terminal to the control terminal of said pull-up means to supply the first signal when said output terminal has an applied voltage equal to or greater than a second voltage level, the second voltage level being higher than the first voltage level; and first pull-down means for controlling said passing means to pass a signal from the first input terminal to the control terminal of said pull-up means when said output terminal has an applied voltage less than the second voltage level;

wherein at least the passing means passes or the control means couples when a voltage between the first voltage level and the second voltage level is applied to the output terminal.

10. The off-chip driver circuit of claim 9, further comprising:

second pull-down means for coupling said output terminal to a source of a second voltage level lower than the first voltage level; and a second input terminal of the driver circuit coupled to the second pull-down means.

11. A method for protecting a pull-up transistor in an off-chip driver circuit from excessive gate-source voltages, the method comprising the steps of:

applying a first signal having a first voltage level to an input terminal of the driver circuit;

applying a second signal that is switchable from a second voltage level to a third voltage level to an output terminal of the driver circuit, the second voltage level being higher than the first voltage level and the first voltage level being higher than the third voltage level;

coupling the output terminal of the off-chip driver circuit to a control terminal of a pull-up transistor when the second signal has a voltage equal to or greater than a fourth voltage level, the fourth voltage level being between the first and second voltage levels; and coupling the control terminal of the pull-up transistor to the input terminal of the driver circuit to receive the first signal when the second signal has a voltage less than the fourth voltage level.

12. The method of claim 11, further comprising the step of:

concurrent with said step of applying the first signal, applying a third signal having the third voltage level to a control terminal of a pull-down transistor electrically connected between the output terminal and a source of the third voltage level.

13. An off-chip driver circuit comprising:

an input terminal;

an output terminal;

a pull-up transistor having a controllable path connected between a first power supply voltage and the output terminal of the off-chip driver circuit and a control terminal connected to the input terminal via a pass gate connected to isolate the input terminal from high voltages applied to the output terminal;

a control transistor having a controllable path connected between the control terminal of the pull-up transistor and the output terminal and a control terminal connected to a control potential;

an auxiliary pass transistor having a control terminal and a controllable path connected between a reference terminal and the control terminal of the pull-up transistor;

an auxiliary control transistor, the auxiliary control transistor having a control terminal connected to receive said control potential and a controllable path connected between the output terminal and the control terminal of the auxiliary pass transistor; and auxiliary circuitry for holding the control terminal of the auxiliary pass transistor in a state determined by the auxiliary control transistor.

14. A driver circuit according to claim 13 wherein the pass gate includes an isolation transistor connected between the input terminal and the control terminal of the pull-up transistor and a control terminal connected to the output terminal.

15. A driver circuit according to claim 13 wherein said auxiliary circuitry comprises an auxiliary pull-down transistor having a controllable path connected between the control terminal of the auxiliary pass transistor and a reference potential, and a control terminal connected to a voltage selected to maintain said pull-down transistor on.

16. A driver circuit according to claim 13 wherein the auxiliary circuitry comprises first and second auxiliary pull-down transistors connected in series between the control terminal of the auxiliary pass transistor and a reference potential, said auxiliary pull-down transistors having control terminals connected to the first power supply voltage.

17. A driver circuit according to claim 13 wherein said reference terminal of said auxiliary pass transistor is connected directly to said input terminal.

18. A driver circuit according to claim 13 which further comprises a main pull-down transistor connected in series between said pull-up transistor and said reference potential, the control terminal of said main pull-down transistor being connected to a second input terminal of the driver circuit.

19. A driver circuit according to claim 13 wherein the pull-up transistor, control transistor, auxiliary pass transistor and auxiliary control transistor are p-channel transistors formed in a common n-well, said driver circuit including a further p-channel transistor for biasing said n-well and having a control terminal coupled to said output terminal.

20. A driver circuit according to claim 14 wherein the isolation transistor is of a first conductivity type and the pass gate further comprises a transistor of a second conductivity type in parallel with said isolation transistor of said first conductivity type and having a control terminal connected to the first power supply voltage.

21. An off-chip driver circuit having an input terminal and an output terminal:

a pull-up transistor having a controllable path connected between a first power supply voltage and the output terminal of the off-chip driver circuit and a control terminal connected to the input terminal via a pass gate connected to isolate the input terminal from high voltages applied to the output terminal;

a control transistor having a controllable path connected between the control terminal of the pull-up transistor and the output terminal and a control terminal connected to a control potential;

an auxiliary pass transistor having a control terminal and a controllable path connected between a reference terminal and the control terminal of the pull-up transistor;

an auxiliary control transistor, the auxiliary control transistor having a control terminal connected to receive said control potential and a controllable path connected between the output terminal and the control terminal of the auxiliary pass transistor; and an auxiliary pull-down transistor having a controllable path connected between the control terminal of the auxiliary pass transistor and a reference potential, and a control terminal connected to a voltage selected to maintain said pull-down transistor on, wherein said auxiliary pull-down transistor holds the control terminal of the auxiliary pass transistor in a state determined by the auxiliary control transistor.

22. An off-chip driver circuit having an input terminal and an output terminal:

a pull-up transistor having a controllable path connected between a first power supply voltage and the output terminal of the off-chip driver circuit and a control terminal connected to the input terminal via a pass gate connected to isolate the input terminal from high voltages applied to the output terminal;

a control transistor having a controllable path connected between the control terminal of the pull-up transistor and the output terminal and a control terminal connected to a control potential;

an auxiliary pass transistor having a control terminal and a controllable path connected between a reference terminal and the control terminal of the pull-up transistor;

an auxiliary control transistor, the auxiliary control transistor having a control terminal connected to receive said control potential and a controllable path connected between the output terminal and the control terminal of the auxiliary pass transistor; and first and second auxiliary pull-down transistors connected in series between the control terminal of the auxiliary pass transistor and a reference potential, said auxiliary pull-down transistors having control terminals connected to the first power supply voltage, wherein said first and second auxiliary pull-down transistors hold the control terminal of the auxiliary pass transistor in a state determined by the auxiliary control transistor.

23. An off-chip driver circuit comprising:

an input terminal;

an output terminal;

a pull-up transistor having a controllable path connected between a first power supply voltage and the output terminal of the off-chip driver circuit and a control terminal connected to the input terminal via a pass gate including an isolation transistor connected between the input terminal and the control terminal of the pull-up transistor and a control terminal connected to the output terminal, the pass gate to isolate the input terminal from high voltages applied to the output terminal;

a control transistor having a controllable path connected between the control terminal of the pull-up transistor and the output terminal and a control terminal connected to a control potential;

an auxiliary pass transistor having a control terminal and a controllable path connected between a reference terminal and the control terminal of the pull-up transistor;

an auxiliary control transistor, the auxiliary control transistor having a control terminal connected to receive said control potential and a controllable path connected between the output terminal and the control terminal of the auxiliary pass transistor; and auxiliary circuitry for holding the control terminal of the auxiliary pass transistor in a state determined by the auxiliary control transistor.

24. A driver circuit according to claim 23 wherein said auxiliary circuitry comprises an auxiliary pull-down transistor having a controllable path connected between the control terminal of the auxiliary pass transistor and a reference potential, and a control terminal connected to a voltage selected to maintain said pull-down transistor on.

25. A driver circuit according to claim 23 wherein the auxiliary circuitry comprises first and second auxiliary pull-down transistors connected in series between the control terminal of the auxiliary pass transistor and a reference potential, said auxiliary pull-down transistors having control terminals connected to the first power supply voltage.

26. A driver circuit according to claim 23 wherein said reference terminal of said auxiliary pass transistor is connected directly to said input terminal.

27. A driver circuit according to claim 23 which further comprises a main pull-down transistor connected in series between said pull-up transistor and said reference potential, the control terminal of said main pull-down transistor being connected to a second input terminal of the driver circuit.

28. A driver circuit according to claim 23 wherein the pull-up transistor, control transistor, auxiliary pass transistor and auxiliary control transistor are p-channel transistors formed in a common n-well, said driver circuit including a further p-channel transistor for biasing said n-well and having a control terminal coupled to said output terminal.

29. A driver circuit according to claim 23 wherein the isolation transistor is of a first conductivity type and the pass gate further comprises a transistor of a second conductivity type in parallel with said transistor of said first conductivity type and having a control terminal connected to the first power supply voltage.

* * * * *